(12) United States Patent
Miyahara (10) Patent No.: US 8,387,247 B2
(45) Date of Patent: Mar. 5, 2013

(54) METHOD FOR MANUFACTURING HEAT RADIATOR HAVING PLATE-SHAPED FINS

(75) Inventor: Hideyuki Miyahara, Nagano-ken (JP)

(73) Assignee: Nakamura Seisakusho Kabushikigaisha, Nagano (JP)

( * ) Notice: Subject to any disclaimer, the term of this patent is extended or adjusted under 35 U.S.C. 154(b) by 996 days.

(21) Appl. No.: 12/217,401

(22) Filed: Jul. 3, 2008

(65) Prior Publication Data

US 2009/0025222 A1     Jan. 29, 2009

(30) Foreign Application Priority Data

Jul. 24, 2007   (JP) ................................. 2007-192707

(51) Int. Cl.
*B21D 53/02*     (2006.01)
*B23P 13/00*     (2006.01)
(52) U.S. Cl. .................. 29/890.03; 29/890.052; 29/557; 72/332; 165/80.3
(58) Field of Classification Search ............... 29/890.03, 29/890.032, 890.052, 557; 72/332; 165/80.3, 165/104.33, 170, 181
See application file for complete search history.

(56) References Cited

U.S. PATENT DOCUMENTS

| | | | |
|---|---|---|---|
| 4,794,985 A * | 1/1989 | Paulman et al. ............... | 165/150 |
| 6,341,651 B1 * | 1/2002 | Ohta ............................. | 165/185 |
| 6,349,762 B2 * | 2/2002 | Ohta ............................. | 165/185 |
| 7,320,177 B2 * | 1/2008 | Miyahara .................... | 29/890.03 |
| 7,637,012 B2 * | 12/2009 | Thors et al. .............. | 29/890.049 |
| 2004/0187307 A1 * | 9/2004 | Wong .............................. | 29/832 |
| 2005/0193559 A1 * | 9/2005 | Miyahara ................... | 29/890.03 |
| 2007/0012431 A1 * | 1/2007 | Miyahara ..................... | 165/170 |
| 2008/0295561 A1 * | 12/2008 | Miyahara ........................ | 72/332 |
| 2009/0025222 A1 * | 1/2009 | Miyahara .................... | 29/890.03 |
| 2010/0202112 A1 * | 8/2010 | Miyahara ..................... | 361/720 |

FOREIGN PATENT DOCUMENTS

| | | |
|---|---|---|
| JP | 2001-156224 | 6/2001 |
| JP | 2005-142247 | 6/2005 |

* cited by examiner

*Primary Examiner* — Alexander P Taousakis
(74) *Attorney, Agent, or Firm* — Flynn, Thiel, Boutell & Tanis, P.C.

(57) ABSTRACT

A gouging tool is introduced at a slope angle θ to form small, low fins at a position shifted inward from an edge of a surface of a metal plate having a high coefficient of thermal conductivity; and the small fins are sequentially formed in a plural number at a fixed pitch until a blade section of the gouging tool reaches a prescribed depth. A fin formation step in which plate-shaped heat-radiating fins are integrally formed upright by the gouging tool is subsequently repeated in sequential manner following formation of the small fins, and the heat-radiating fins are continuously formed in a plural number in the metal plate. Heat-radiating fins of a heat radiator can be formed by a gouging tool without generating scrap.

3 Claims, 6 Drawing Sheets

(Prior Art)

FIG.8

(Prior Art)

METHOD FOR MANUFACTURING HEAT RADIATOR HAVING PLATE-SHAPED FINS

TECHNICAL FIELD

The present invention relates to a heat radiator for efficiently radiating heat that is generated in, e.g., electronic components and the like, and specifically relates to a method for manufacturing a heat radiator having plate-shaped fins integrally formed on a metal plate via a cutting tool.

BACKGROUND ART

Ordinary heat radiators that are used in actual practice for radiating heat generated in semiconductor ICs and other electronic components have a plurality of pectinate heat-radiating fins formed perpendicularly on a base. The heat radiator radiates heat outward via the heat-radiating fins of the heat radiator by direct or indirect contact with an electronic component or the like. The heat radiator is generally manufactured by extruding or casting an aluminum metal material having a high coefficient of thermal conductivity.

Methods of manufacturing heat radiators on which heat-radiating fins are formed by using a cutting tool are disclosed in JP-A 2001-156224 (Patent Document 1) and JP-A 2005-142247 (Patent Document 2). In the method for manufacturing a heat radiator described in Patent Document 1, a heat-sink material is used that is composed of an extruded aluminum alloy on which is formed a jetty-shaped machining portion for forming fins on a top surface of a substrate. A plurality of fins is formed by using a bit or another cutting tool to gouge the fin-forming machining portion.

In the method for manufacturing a heat radiator described in Patent Document 2, a hoop-shaped metal plate having a high coefficient of thermal conductivity and a cutting tool on which a blade section is formed at the leading edge side in the direction of movement are moved relative to each other at a prescribed angle, and a plate-shaped heat-radiating fin is integrally formed upright by gouging the hoop-shaped metal plate. Next, the hoop-shaped metal plate and the gouging tool are moved relative to each other from the upstream side at a distance of the formation pitch from the machining surface on which the heat-radiating fin has been formed upright, and the next plate-shaped heat-radiating fin is integrally formed upright by gouging the hoop-shaped metal plate. Afterward, a plurality of heat-radiating fins is successively formed on the hoop-shaped metal plate by sequentially repeating the gouging step.

Figure 7:
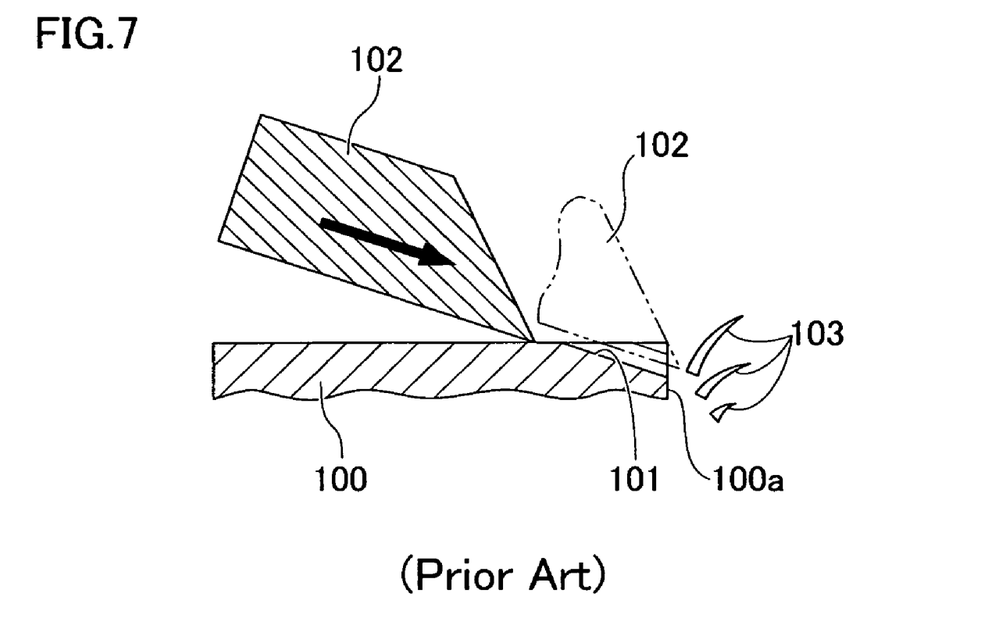
FIG. 7 is a partial cross-sectional view showing a conventional method of forming a heat radiator.

The plurality of fins described in Patent Document 1 is a plurality of fins formed at the same height on the surface of heat-sink material. When attempting to form fins of the same height, first, a sloped surface 101 must be formed on a leading edge portion 100a of a fin-forming machining portion 100, as shown in FIG. 7. The sloped surface 101 is formed by cutting the fin-forming machining portion 100a plurality of times using a cutting tool 102, but low and thin fin-shaped scraps 103 are inevitably generated by cutting.

Figure 8:
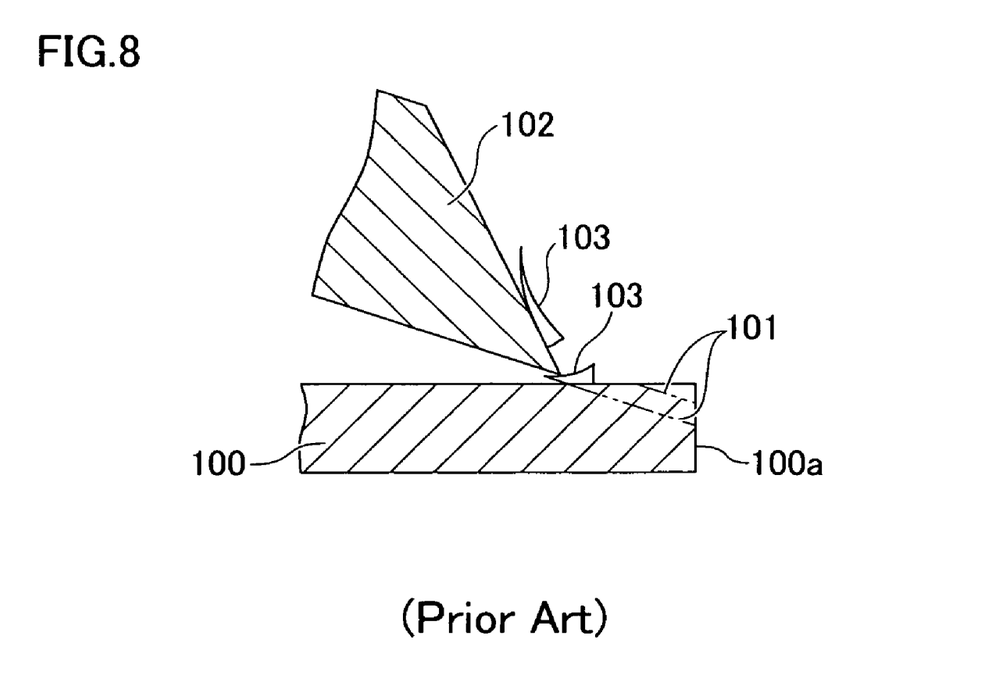
FIG. 8 is a descriptive diagram showing problems in a conventional method of forming a heat radiator.

Ordinarily, cutting oil is applied to the fin-forming machining portion 100 and the cutting machine tool 102 when the fins are gouged out. There are occasions when the scraps 103 are thin and therefore adhere to the fin-forming machining portion 100 and the cutting tool 102 after being cut off from the heat-sink material, as shown in FIG. 8. Even when air or the like is used in an attempt to remove the adhering scraps 103, the scraps 103 are thin and therefore adhere to the cutting tool 102 and other blade surfaces because of the machining oil, and sometimes cannot be removed. In the particular case that the scraps 103 adhere to the surface of the fin-forming machining portion 100 in a state in which the scraps are sandwiched between the surface of the fin-forming machining portion 100 and the cutting machine tool 102, as shown in FIG. 8, fins cannot be gouged out, or are deformed and are produced as defective fins.

In the method of forming plate-shaped heat-radiating fins disclosed in Patent Document 2 as well, there are occasions when removing thin, fin-shaped scrap becomes difficult in the same way as in Patent Document 1 because low fin-shaped scrap is generated at one end of the metal plate on hoop-shaped metal plate when heat-radiating fins are formed from one end of the hoop-shaped metal plate. Accordingly, the fin-shaped scraps are sandwiched between the surface of the hoop-shaped metal plate and the cutting tool, and a problem occurs in that the heat-radiating fin that is subsequently formed is formed in a deformed state, or a problem occurs in that the next heat-radiating fin cannot be gouged out.

Patent Document 1 Japanese Laid-open Patent Application No. 2001-156224

Patent Document 2 Japanese Laid-open Patent Application No. 2005-142247.

SUMMARY OF INVENTION

Technical Problem

As described above, thin, fin-shaped scrap will sometimes adhere to a metal plate made as the heat sink material or to a bit or another cutting tool because of the presence of the cutting oil in a method for manufacturing a heat radiator having heat-radiating fins that are formed using a conventional cutting tool. The fin-shaped scraps that have adhered become an obstacle when the next fin is formed, and a problem occurs in that a normal fin cannot be formed. Another problem occurs in that the cutting tool is damaged when the fin-shaped scrap cannot be removed and the blade section of the cutting tool gouges out a fin while fin-shaped scraps remain adhered to the blade section because the machining oil has a bonding function.

An object of the present invention is to provide a method for manufacturing a heat radiator having plate-shaped fins that enable the formation of a plurality of fins without generating scrap using a cutting tool in arbitrary locations of the metal material.

Solution to the Problem

In order to solve the problems described above, the method for manufacturing a heat radiator according to an aspect of the present invention comprises: providing an aluminum, copper, or another metal plate having a high coefficient of thermal conductivity, and a cutting tool on which a blade section is formed toward the leading edge in the direction of movement; moving the metal plate and the cutting tool relative to each other at a prescribed angle and gouging the metal plate using the blade section of the cutting tool, whereby a plate-shaped heat-radiating fin is integrally formed upright; moving the metal plate and the cutting tool relative to each other from the upstream side at a distance of the formation pitch from the machining surface that is formed by the upright formation of the heat-radiating fin; gouging the metal plate using the cutting tool, whereby the next plate-shaped heat-radiating fin is integrally formed upright; and sequentially repeating the gouging step thereafter to continuously form a plurality of heat-radiating fins in the metal plate;

the method for manufacturing a heat radiator having plate-shaped fins comprising:

inserting the cutting tool at a prescribed position set at a distance from one end of the metal plate in a state in which the metal plate and the cutting tool have a prescribed angle;

sequentially forming a plurality of small fins having a small dimension in which the base portion is connected to the metal plate;

moving the metal plate and the cutting tool in relation to each other from the upstream side at a distance of the formation pitch from the machining surface after the blade section of the cutting tool has reached a prescribed depth;

sequentially repeating the fin formation step in which the plate-shaped heat-radiating fins are integrally formed upright; and continuously forming a plurality of heat-radiating fins on the metal plate.

The method for manufacturing a heat radiator according to another aspect of the present invention comprises: sequentially forming a plurality of the small fins at a greater height from a prescribed position set at a distance from one end of the metal plate to a position of the heat-radiating fins.

The method for manufacturing the heat radiator according to yet another aspect of the present invention comprises: forming the fins so that the plate thickness at the heat-radiating fins toward the base ends thereof is great and is gradually reduced in progression to the distal-end portion; widening at least the portions of the heat-radiating fins toward the base ends thereof in the direction of the two ends; and joining the heat-radiating fins to the interior wall when the heat-radiating fins are formed upright on the metal plate by the cutting tool in the fin formation step.

The method for manufacturing the heat radiator according to still another aspect of the present invention comprises: forming the width of the cutting tool to be less than the width of the metal plate; and forming a flange part having the thickness of the metal plate on the two sides of the plurality of heat-radiating fins.

Next, the method for manufacturing a heat radiator according to the present invention is characterized in that:

a fin formation step is repeatedly performed at a prescribed pitch in a prescribed direction along a surface of a metal plate, wherein the surface of a metal plate having a prescribed coefficient of thermal conductivity is gouged at a prescribed width and thickness by a cutting tool in a manner that a fin is formed in a state in which the basal end is connected to the metal plate, the height of the formed fins is gradually increased by sequentially increasing the gouging depth from the surface of the metal plate by the cutting tool from the first fin formation step; and the fin formation step is repeated to a fixed depth so that heat-radiating fins of the same height are repeatedly formed after the gouging depth reaches the fixed depth.

The method for manufacturing a heat radiator according to the present invention is characterized in that the fins are formed in the fin formation step to a thickness that gradually increases from the distal end of the fin to the basal end; and the fins are formed so as to achieve a state in which the locations of the fins toward the base ends thereof are widened to the two sides in the width direction in relation to the locations of the fins toward the distal ends thereof, whereby a state is formed in which the locations on the two sides of the fins toward the base ends thereof are pressed against the inside walls of the two sides of concavities formed on the surface of the metal plate by the formation of the fins.

The method for manufacturing a heat radiator according to the present invention is characterized in that a cutting tool is used in which the width is less than the width of the metal plate; and a portion of the metal plate is retained while the original plate thickness is left unchanged without being gouged out by the cutting tool in a state in which the fins are enclosed.

ADVANTAGEOUS EFFECTS OF THE INVENTION

In accordance with the method for manufacturing a heat radiator having plate-shaped fins of the present invention, a cutting tool is inserted at a prescribed position set at a distance from one end of the metal plate to form small fins having a small dimension, the base end of which is integrally connected to the metal plate. Therefore, the formation of thin scrap fins is prevented in advance. Accordingly, the work of removing scrap is made unnecessary, and problems are solved in which the deformation of heat radiating fins occurs and fins cannot be formed by gouging due to scrap adhering to the metal plate or the cutting tool.

A plurality of small fins is sequentially formed with an increasing size from the prescribed position set at a distance from one end of the metal plate to the position of the heat-radiating fins, whereby sloped surfaces are formed by the apices of the plurality of small fins. Therefore, a cooling medium is more readily received from the small fin side and a heat radiator having highly efficient heat radiation can be formed.

In the fin formation step, the plate thickness of the cut fins toward the base ends thereof is formed to be great, whereby the cut fins are widened at least at the two ends on the base-end side. Therefore, the two ends of the base portion of the heat-radiating fins are pressed by the interior wall of the concavity, the heat of the metal plate is conducted to the two ends as well, and a heat radiator having highly efficient heat radiation can be formed.

The width of the gouging tool is formed to be less than the width of the metal plate, whereby a flange part having the thickness of the metal plate can be formed on the two sides of the plurality of heat-radiating fins. The flange part may have a heat radiator mounted thereon, or may be provided with a covering material on the upper portion of heat radiating fins, and constitutes part of a heat pump, a vapor chamber, or another liquid-cooled heat exchanger.

BRIEF DESCRIPTION OF DRAWINGS

FIG. 2(A) through (F) are descriptive diagrams of the production steps showing the steps for forming the plate-shaped fins of FIG. 1;

BEST MODE FOR CARRYING OUT THE INVENTION

Embodiments of the method for manufacturing a heat radiator having plate-shaped heat-radiating fins according to the present invention shall be described hereinafter with reference to the accompanying drawings.

(Embodiment 1)

Figure 1:
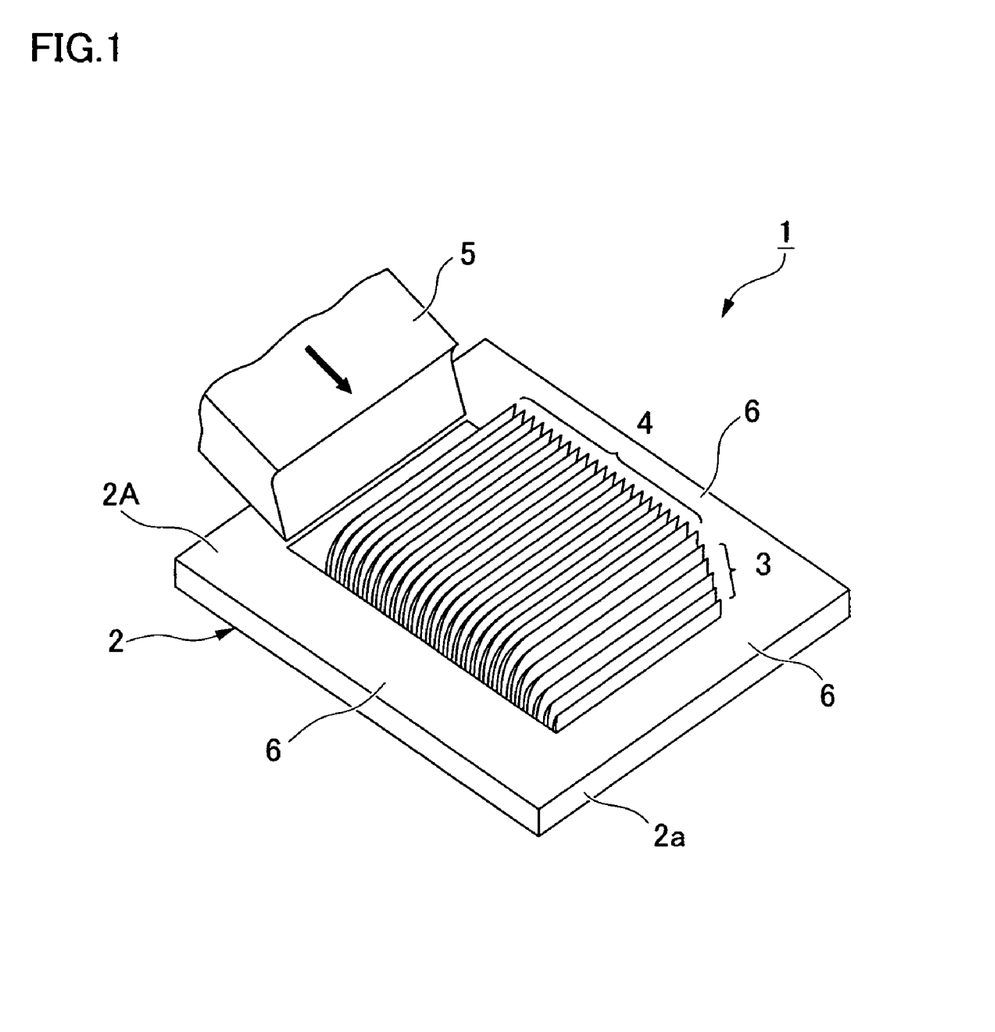
FIG. 1 is a perspective view showing an example of a heat radiator having plate-shaped fins according to Embodiment 1 of the present invention.

FIG. 1 is a perspective view showing a heat radiator having plate-shaped heat-radiating fins according to Embodiment 1. A plastically workable metal material having a high coefficient of thermal conductivity can be used for the metal plate 2 used in a heat radiator 1. For example, it is possible to use a rectangular metal plate 2 having a uniform thickness and formed from aluminum, aluminum alloy, copper alloy, stainless steel, or another metal material.

Figure 3:
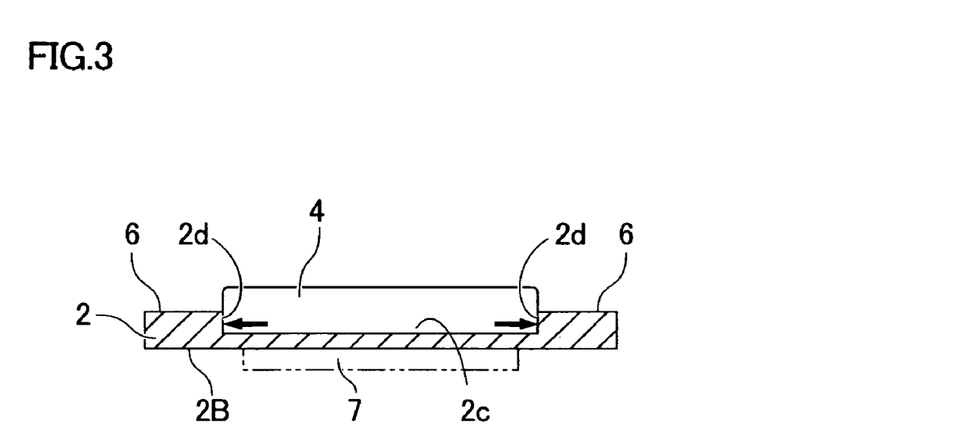
FIG. 3 is a cross-sectional view of the heat radiator of FIG. 1.
Figure 4:
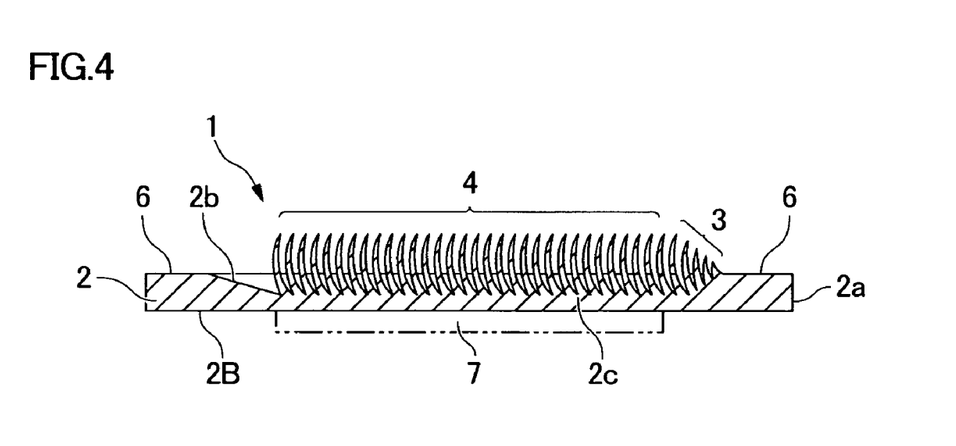
FIG. 4 is a longitudinal-sectional view of the heat radiator of FIG. 1.

A plurality of small, low fins 3 is formed in a section (at a prescribed position set at a distance from one end of the metal plate) located inward from an outside edge 2a of a surface 2A (one of the surfaces) of the metal plate 2. Subsequent to these small fins 3, thin plate-shaped heat-radiating fins 4 having the same height are formed. The small fins 3 are formed from one outside edge 2a of the metal plate 2 so as to gradually increase in height until the heat-radiating fins 4 are reached. The base-end portion of the small fins 3 and the heat-radiating fins 4 are integrally connected from the concavities 2c formed on the surface 2A of the metal plate 2, as shown in FIGS. 3 and 4. The leading edge side of the heat-radiating fins 4 is somewhat curved, and the plurality of heat-radiating fins 4 is formed upright at the same angle and at equidistant intervals. The plurality of heat-radiating fins 4 of the heat radiator 1 is also formed thickly at the base-end portion connected to the metal plate 2, and are reduced in thickness in progression to the distal-end portion.

The plate thickness of the small fins 3 and the heat-radiating fins 4 can be reduced because the fins are formed by gouging out the surface 2A of the metal plate 2. For example, a plate width of around 0.03 mm to 1.0 mm is advantageous for a heat-radiating fin 4 of a heat radiator used in a miniature electronic component. The spacing between the heat-radiating fins 4 is arbitrarily set to 0.01 mm or greater. The heat-radiating fins 4 may be formed so that the plate thickness or spacing between each is different. Furthermore, when the thickness of the heat-radiating fin 4 is great at the base end portion and is reduced in progression to the distal end portion, the thermal capacity is high because the base end portion is thick, and the fins readily accept heat from the metal plate 2. Afterward, as heat is transmitted in sequence in the direction of the distal end portion, heat is readily radiated even when the distal end portion has low thermal capacity. The thickness of the heat-radiating fins 4 varies in conjunction with heat transmission and radiation. Therefore, a heat radiator 1 having high heat radiation efficiency can be obtained.

Next, a method for manufacturing the heat radiator 1 will be described with reference to FIG. 2. The metal plate 2 described above has a necessary plate thickness and width for forming the heat radiator 1, and is mounted on a press apparatus (not shown). Afterward, small fins 3 and heat-radiating fins 4 are formed upright by the gouging tool 5 (cutting tool).

The gouging tool 5 has a blade section 5a formed on the leading edge of the bottom surface side and extending in a direction perpendicular to the gouging direction (direction of movement) of the gouging tool 5. The width of the blade section 5a is set to a dimension that is less than the width of the metal plate 2. The gouging tool 5 is mounted on a drive apparatus (not shown) in a sloped orientation at a prescribed slope angle θ so that a rear end side is higher than the surface 2A of the metal plate 2. The slope angle θ is suitably set depending on the height and width of the heat-radiating fins 4, the quality of the material of the metal plate 2, or the like, but is ordinarily set at 5° to 20°. The two side surfaces in the direction of the width of the gouging tool 5 are substantially perpendicular to the bottom surface of the gouging tool 5, but the two side sections disposed toward the bottom surface on which the blade section 5a is formed may be a tapered shape that narrows in progression to the bottom surface, or may be formed into an arc shape.

First, the gouging tool 5 is pressed into the metal plate 2 by a driving apparatus along the direction of the arrow at the slope angle θ in a state in which the blade section 5a of the gouging tool 5 makes contact in a position inward from an outside edge 2a of a surface 2A of the metal plate 2, as shown by the two-dash line in FIG. 2(A). As a result, the blade section 5a of the gouging tool 5 bites into the surface 2A of the metal plate 2, and a thin small fin 3 is formed upright as shown by the solid line in FIG. 2(A). At this time, it is preferable that the pressure for inserting the gouging tool 5 into the metal plate 2 be set to a level that will not cause deformation or stress in the metal plate 2. The height of the small fin 3 is reduced by reducing the depth d1 of the insertion of the gouging tool. A machining surface 2b sloped in an amount equal to the slope angle θ of the gouging tool 5 is formed on the surface 2A of the metal plate 2 by the upright formation of the small fin 3.

Next, the metal plate 2 and the gouging tool 5 are moved relative to each other, the blade section 5a is retracted to a position where a gouging width t can be obtained upstream from the upstream edge in the gouging direction on the machining surface 2b, and the blade section makes contact at this location, as shown by FIG. 2(B). The gouging width t is set at approximately 0.1 mm to 3.0 mm. The gouging tool 5 is moved in the direction of the arrow (in the gouging direction) at the slope angle θ, and bites into the metal plate to a depth d2 which is greater than that of the initially formed small fin 3, as shown in FIG. 2(C). As a result, a small fin 3 is formed upright to a greater height than that of the first small fin 3.

Afterward, the gouging tool 5 is retracted to a position where a gouging width t can be obtained upstream from the upstream edge on the machining surface 2b formed by the upright formation of the small fins 3, and the blade section makes contact at this location.

The gouging tool 5 is moved in the gouging direction in a state in which the slope angle θ is maintained, and bites into the metal plate deeper than during the upright formation of the previously formed small fins 3, and a small fin 3 is formed upright to a greater height. In this way, the upright formation of small fins 3 is repeated while the biting depth is gradually increased. The step for forming the small fin 3 is ended when the blade section 5a reaches a prescribed depth d3, as shown in FIG. 2(D).

When the small fins 3 are sequentially formed at a fixed pitch that corresponds to the gouging width t from the location of the metal plate surface 2A inward from an end 2a of the metal plate 2, the height of the plurality of small fins 3 gradually increases. As a result, an imaginary surface in contact with the apices of the small fins 3 is a sloping surface.

Subsequent to the upright formation of the small fins 3, a transition is made to the fin formation step, and heat-radiating fins 4 of the same height are formed. In other words, the blade section 5a of the gouging tool 5 is moved until a prescribed depth d3 is reached from a position where a gouging width t can be obtained upstream from the machining surface 2b formed by the lastly formed small fin 3, whereby heat-radiating fins 4 having the same prescribed height are formed upright, as shown in FIG. 2(E). Next, the gouging tool 5 is moved to a position upstream from the machining surface 2b and the gouging step is sequentially repeated by moving the gouging tool until a prescribed depth d3 is reached, whereby a plurality of heat-radiating fins 4 is formed upright at the same angle and at equidistant intervals, as shown in FIG. 2(F). The concavities 2c having a thinly formed bottom surface are formed in the metal plate 2 by the formation of a plurality of heat-radiating fins 4, as shown in FIGS. 3 and 4, and interior walls 2d are formed on the two sides.

In the fin formation step, when heat-radiating fins 4 are formed upright on the metal plate 2 by the gouging tool 5, the heat-radiating fins 4 are formed so that the thickness at the base end portion is great and is gradually reduced in progression to the distal end portion, as shown in FIG. 4. The heat-radiating fins 4 toward the base ends thereof increases in thickness and simultaneously widens in the direction of the two sides as indicated by the arrows, as shown in FIG. 3. Accordingly, the ends of the heat-radiating fins 4 toward the base are pressed against the interior walls 2d. As a result, even when the heat-radiating fins 4 are thinly formed to a thickness of about 0.05 mm, the portions at the two sides of the heat-radiating fins 4 toward the base are held in place by the interior walls 2d of the metal plate 2.

Therefore, the mechanical strength of the heat-radiating fin 4 can be increased. Since a state is formed in which the portions of the heat-radiating fins 4 toward the base end are thermally connected to the metal plate 2, heat radiation efficiency can be improved.

On the other hand, a sloped machining surface 2b that extends from the bottom surface of a concavity 2c to a surface of the metal plate 2 is left behind on the upstream side of the heat-radiating fins 4 on the opposite side from the small fins 3, as shown in FIG. 4.

This sloped machining surface 2b can act as a heat-radiating surface. Also, a flange part 6 having the thickness of the metal plate 2 remains to the rear of the machining surface 2b.

The flange part 6 having the thickness of the metal plate 2 is formed in the same manner on the two sides of the plurality of heat-radiating fins 4 formed on the metal plate 2.

The flange part 6 can be formed by setting the width of the gouging tool 5 to be less than the width of the metal plate 2. As a result, the flange part 6 that is formed on the heat radiator 1 is formed so as to surround the heat-radiating fins 4 and the small fins 3, as shown in FIG. 1.

The flange part 6 may be have the heat radiator 1 mounted thereon, or a covering member (not shown) may be joined on the surface and sealed to the upper portion of the heat-radiating fins 4 to form a heat pump, a vapor chamber, or another liquid-cooled heat exchanger.

For example, an IC chip 7 may be disposed in a location that corresponds to the heat-radiating fins 4 on a back surface 2B of the heat radiator 1, as shown by the two-dash line in FIGS. 3 and 4, whereby heat generated from the IC chip 7 is transmitted to the heat-radiating fins 4 via the metal plate 2, and is radiated into the air from the surface of the heat-radiating fins 4. In this case, heat radiation performance is not affected even when the small fins 3 are short, because the IC chip 7 is positioned in the central portion of the heat-radiating fins 4. It is apparent from testing that the heat radiation performance is not affected even when the machining surface 2b left behind on the upstream side of the heat-radiating fins 4 is formed. The base end portion of the small fins 3 and the heat-radiating fins 4 are integrally connected from the concavities 2c that are formed on the surface 2A of the metal plate 2. Also, the plate between the concavities 2c and the back surface 2B of the metal plate 2 is thinly formed. Therefore, heat generated from the IC chip 7 is rapidly transmitted to the small fins 3 and the heat-radiating fins 4, and heat-radiating efficiency is increased. This fact also has been made apparent by testing.

When a gouging tool 5 is used in which the two side portions of the bottom surface on which the blade section 5a is formed are tapered or arcuately formed, a tapered or arcuate surface is formed between the concavities 2c and the interior walls 2d. In the particular case that the heat radiator 1 described above is used in a heat pump, a vapor chamber, or another liquid-cooled heat exchanger, the liquid or other fluid acting as a cooling medium flows smoothly by way of the tapered surface or arc surface, enabling greater refrigerant efficiency. When the two sides of the bottom surface side of the gouging tool 5 are tapered or arcuately formed, the force that presses the two sides of the base edge of the heat-radiating fin 4 against the interior walls 2d increases in comparison with the example shown in FIG. 3. Therefore, the cooling medium is made to uniformly flow between the heat-radiating fins 4 because the spaces between the heat-radiating fins 4 are mutually independent and separate.

(Embodiment 2)

Figure 5:
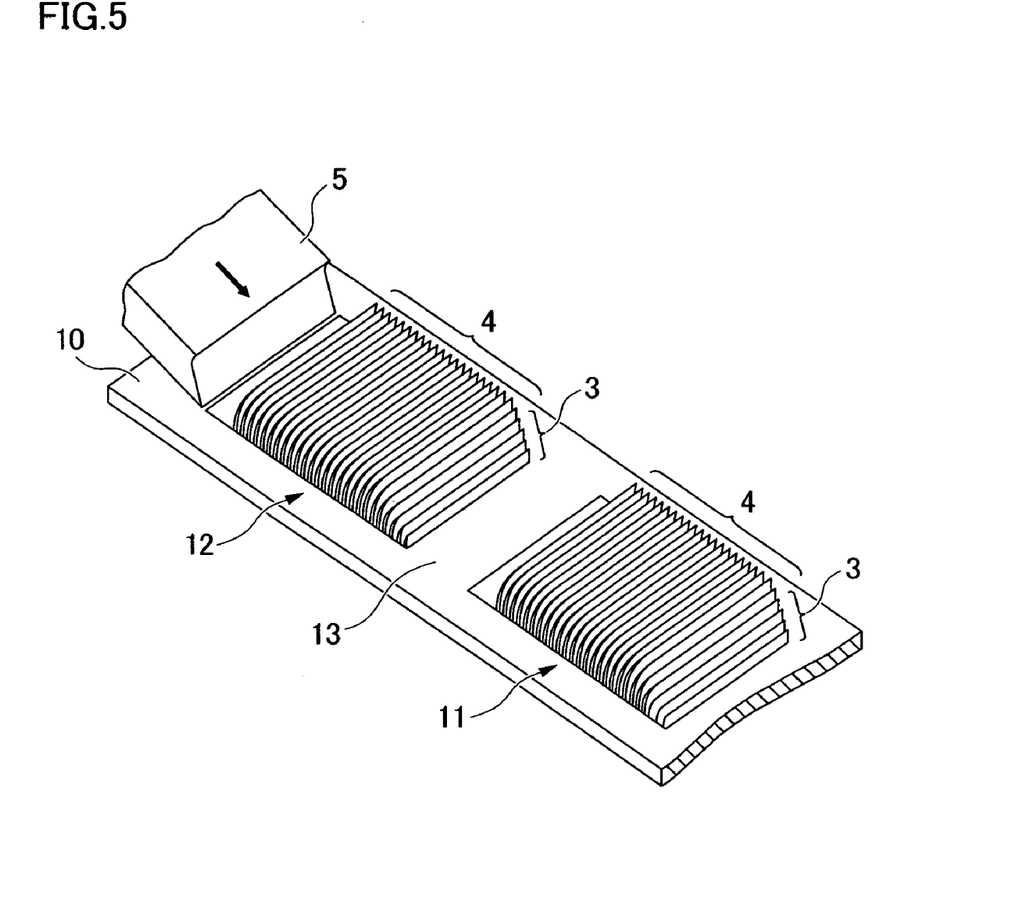
FIG. 5 is a perspective view showing the state of forming plate-shaped fins on a hoop-shaped metal plate according to Embodiment 2 of the present invention.

FIG. 5 shows an example in which a hoop-shaped metal plate 10 is used as the metal plate in the method for manufacturing a heat radiator having plate-shaped fins according to the present invention. The hoop-shaped metal plate 10 can be plastically worked in the same manner as in Embodiment 1 described above, and aluminum, aluminum alloy, copper alloy, stainless steel, or another metal material is used as the metal material having a high coefficient of thermal conductivity.

A plurality of heat-radiating fins 4 is formed subsequent to the formation of the plurality of small fins 3 in the same manner as in Embodiment 1 described above on the hoop-shaped metal plate 10 as well, to form a first fin group 11. A plurality of heat-radiating fins 4 is formed subsequent to the formation of the plurality of small fins 3 to form a second fin group 12 separated by spaces 13 at prescribed intervals, and fin groups are sequentially formed while providing the spaces 13 at prescribed intervals. Afterward, the hoop-shaped metal plate 10 in which a plurality of fin groups is formed is severed at the spaces 13 by widely known cutting means, and a heat radiator 1 is formed, as shown in FIG. 1. After the single fin group 11 has been formed, the group may be severed by widely known cutting means, and the fin group 12 may be formed on a surface at a distance from one end of the hoop-shaped metal plate 10.

Large-scale production is made possible by using the hoop-shaped metal plate 10 in this way. The spaces may be severed after a plurality of two or more fin groups having the same or different shapes is formed. When the next fin group is formed after a single fin group has been formed, the direction may be changed, e.g., 90° and the first fin group and the second fin group may be set at right angles, by changing the direction by, e.g., 90°.

(Embodiment 3)

Figure 6:
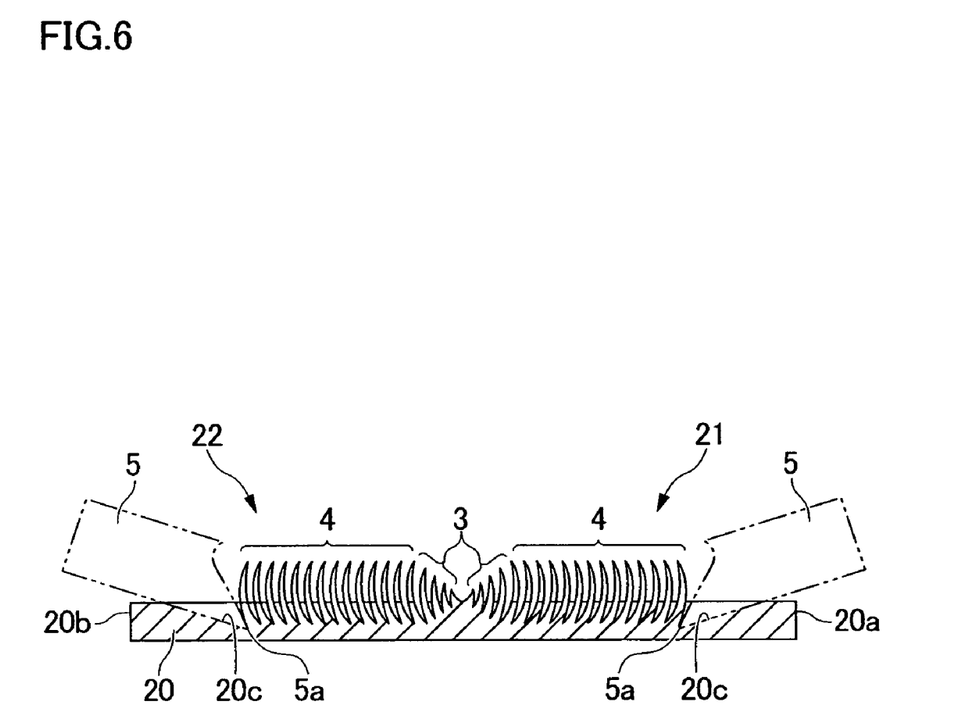
FIG. 6 is a cross-sectional view showing a heat radiator having a pair of fin groups formed on the left and the right of a metal plate according to Embodiment 3 of the present invention.

FIG. 6 shows an embodiment in which a pair of fin groups on the left and right are formed by forming a plurality of small fins from the center of the metal plate, followed by a plurality of heat-radiating fins in the method for manufacturing the heat radiator having plate-shaped fins according to the present invention.

Figure 2:
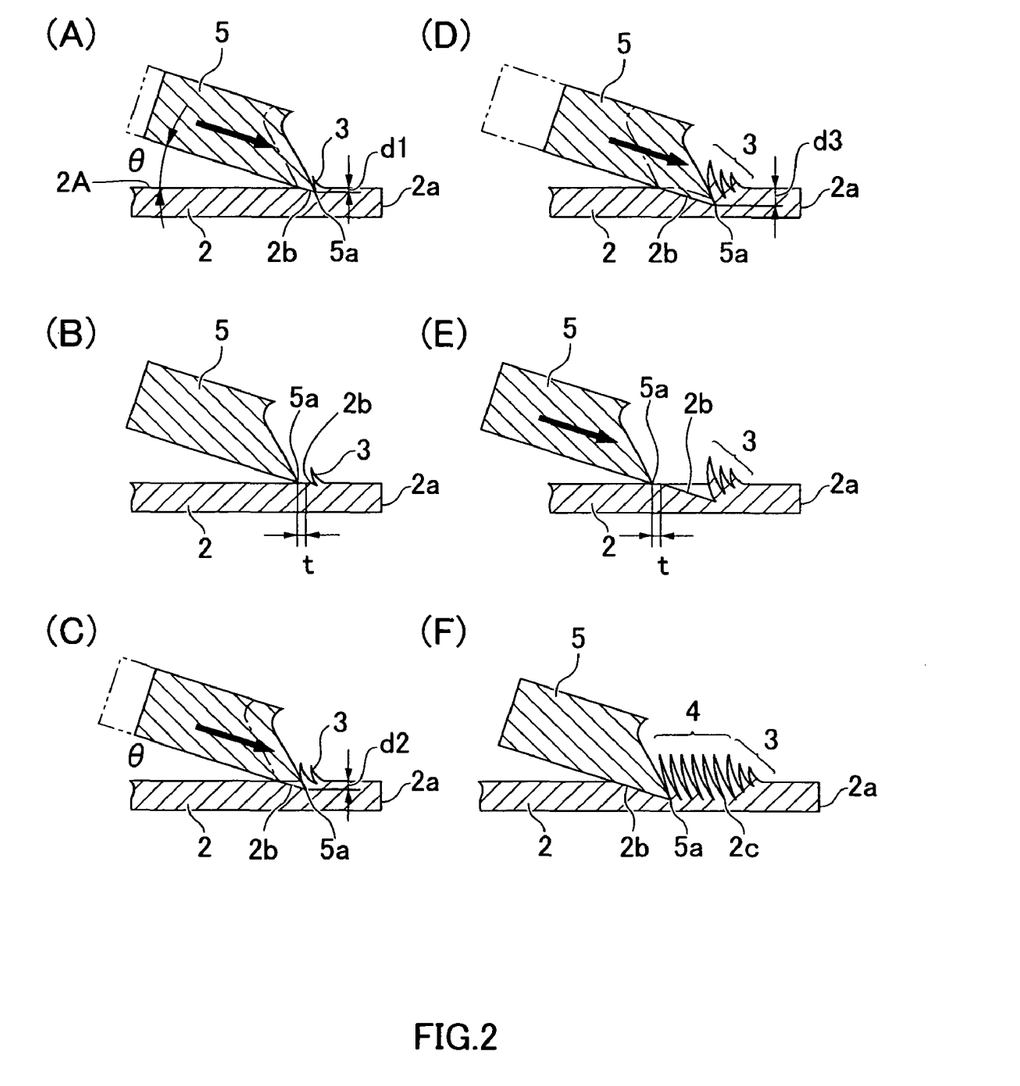

In the embodiment shown in FIG. 6, the blade section of the gouging tool 5 is brought into contact with a prescribed position at the center of the metal plate 20 in the same manner as in the formation method shown in FIG. 2 described above, the blade section 5a of the gouging tool 5 is thereafter made to bite into a surface of the metal plate 20 at a prescribed angle, and a thin small fin 3 having a low profile is formed upright. Afterward, the small fin is formed upright a plurality of times until the blade section 5a of the gouging tool 5 reaches a prescribed depth. A transition is thereafter made to the fin formation step subsequent to the upright formation of the small fins 3, a plurality of heat-radiating fins 4 having the same height is successively formed, and the fin formation step is ended when a prescribed distance from one edge 20a of a metal plate 20 is reached. A sloped machining surface 20c is formed at this time on the metal plate 20 side. As a result, the first fin group 21 is formed on one end side 20a from the center of the metal plate 20.

Next, a second fin group 22 is formed on the other end side 20b from the center of the metal plate 20. In this case, the gouging tool 5 is set in the opposite direction from when the first fin group 21 was formed. A plurality of thin small fins 3 having a low profile is sequentially formed upright by the gouging tool 5 in the same way as when the first fin group 21 described above was formed. Next, a transition is made to the fin formation step, and a plurality of heat-radiating fins 4 having the same height is successively formed upright. The fin formation step is ended when a prescribed distance from the other edge 20b of the metal plate 20 is reached, and a sloped machining surface 20c is formed on the other end 20b side of the metal plate 20.

When the first and second fin groups 21, 22 are formed on the left and right of the metal plate 20 in this way, the fin groups 21, 22 have small fins 3 and heat-radiating fins 4. Because these fins are formed facing each other, heat radiators that correspond to the flow of a cooling medium can be manufactured because the interaction with the cooling medium that performs the heat radiation varies.

(Other Embodiments)

The present invention was described in detail above on the basis of embodiments of the present invention, but the present invention is not limited by the abovementioned embodiments. For example, in addition to being shaped in a plate-shaped aluminum, copper, or other metal material having a good thermal conductivity as a metal plate, heat-radiating fins may also be formed in a metal storage member, a casing, or another area that requires a heat-radiating function in order to radiate heat generated by, e.g., a printed circuit board or a light-emitting element having the metal material described above as a core that has been machined or will be machined afterwards. In the embodiments described above, a plurality of heat-radiating fins is formed parallel to one end of the metal plate, but the fins may be formed at a prescribed angle. When a plurality of fin groups is formed, a first fin group and a second fin group may be set perpendicular to each other or otherwise formed with suitably different formation angles.

The invention is claimed is:

1. A method of manufacturing a heat radiator comprising the steps of:
   providing a metal plate having a prescribed coefficient of thermal conductivity;
   providing a cutting tool having a blade part formed on a distal end thereof;
   positioning the cutting tool at a surface of the metal plate at a prescribed distance from an end of the metal plate;
   performing a fin-formation step with the cutting tool at a prescribed pitch and in a prescribed direction along the surface of the metal plate by gouging the surface of the metal plate at a prescribed width and thickness with the cutting tool to form a fin having a basal end thereof connected to the metal plate;
   sequentially increasing the gouging depth of the surface of the metal plate during subsequent fin-formation steps with the cutting tool to gradually increase the height of the formed fins until a fixed gouging depth is reached;
   and performing the fin-formation step at the fixed gouging depth with the cutting tool to form heat-radiating fins of the same height.

2. The method for manufacturing a heat radiator having plate-shaped fins according to claim 1, characterized in that
   the fins are formed in the fin formation step to a thickness that gradually increases from a distal end of the fin to the basal end thereof; and
   the fins are formed so as to achieve a state in which the locations of the fins toward the basal ends thereof widen to two sides in the width direction in relation to the locations of the fins toward the distal ends thereof, whereby a state is formed in which the two sides of the fins toward the basal ends thereof press against inside walls of a concavity formed in the surface of the metal plate by the formation of the fins.

3. The method for manufacturing a heat radiator having plate-shaped fins according to claim 1, characterized in that
   the cutting tool has a width less than the width of the metal plate; and
   a portion of the metal plate is retained while the original plate thickness is left unchanged without being gouged out by the cutting tool in a state in which the fins are enclosed.

* * * * *